United States Patent
Yen et al.

(10) Patent No.: US 6,579,777 B1
(45) Date of Patent: *Jun. 17, 2003

(54) METHOD OF FORMING LOCAL OXIDATION WITH SLOPED SILICON RECESS

(75) Inventors: Ting P. Yen, Fremont, CA (US); Pamela S. Trammel, San Jose, CA (US); Philippe Schoenborn, San Jose, CA (US); Alexander H. Owens, Los Gatos, CA (US)

(73) Assignees: Cypress Semiconductor Corp., San Jose, CA (US); LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1145 days.

(21) Appl. No.: 08/587,417

(22) Filed: Jan. 16, 1996

(51) Int. Cl.⁷ ............................... H01L 21/76
(52) U.S. Cl. .................... 438/444; 438/296; 438/297; 438/359; 438/362; 438/425
(58) Field of Search ........................... 437/72, 69, 70, 437/71, 66, 68, 67; 438/439, 296, 297, 359, 362, 425, 444

(56) References Cited

U.S. PATENT DOCUMENTS

| | | | | |
|---|---|---|---|---|
| 4,569,698 A | * | 2/1986 | Feist ........................ | 438/442 |
| 4,615,103 A | * | 10/1986 | Kameyama et al. ....... | 438/430 |
| 4,630,356 A | * | 12/1986 | Christie et al. ............ | 438/444 |
| 4,639,288 A | * | 1/1987 | Price et al. ................. | 156/643 |
| 4,965,221 A | * | 10/1990 | Dennison et al. ............. | 437/72 |
| 4,992,390 A | * | 2/1991 | Chang .......................... | 437/42 |
| 5,254,495 A | | 10/1993 | Lur et al. | |
| 5,296,094 A | * | 3/1994 | Shan et al. ................. | 156/651 |
| 5,431,778 A | * | 7/1995 | Dahm et al. ............. | 156/662.1 |

FOREIGN PATENT DOCUMENTS

| | | | | | |
|---|---|---|---|---|---|
| JP | 0065086 | * | 6/1978 | ................. | 437/72 |
| JP | 54124986 | * | 9/1979 | ................. | 437/72 |
| JP | 60116146 | * | 6/1985 | ................. | 437/72 |
| JP | 59257989 | * | 6/1986 | ................. | 437/72 |

OTHER PUBLICATIONS

Wolf, Stanley, Silicon Processing for the VLSI Era, vol. 2, p 30, 1990.*
Wolf, Stanley *Silicon Processing for the VLSI ERA*, vol. 2, pp. 39–41, 1990.*
Wolf, Stanley, Silicon Processing.*

* cited by examiner

*Primary Examiner*—Erik Kielin
(74) *Attorney, Agent, or Firm*—Christopher P. Maiorana, P.C.

(57) ABSTRACT

A method of forming a localized oxidation having reduced bird's beak encroachment in a semiconductor device by providing an opening in the silicon substrate that has sloped sidewalls with a taper between about 10° and about 75° as measured from the vertical axis of the recess opening and then growing field oxide within the tapered recess opening for forming the localized oxidation.

20 Claims, 1 Drawing Sheet

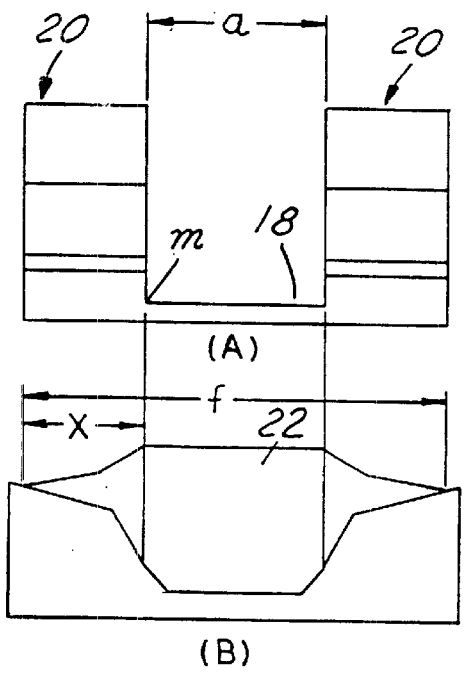
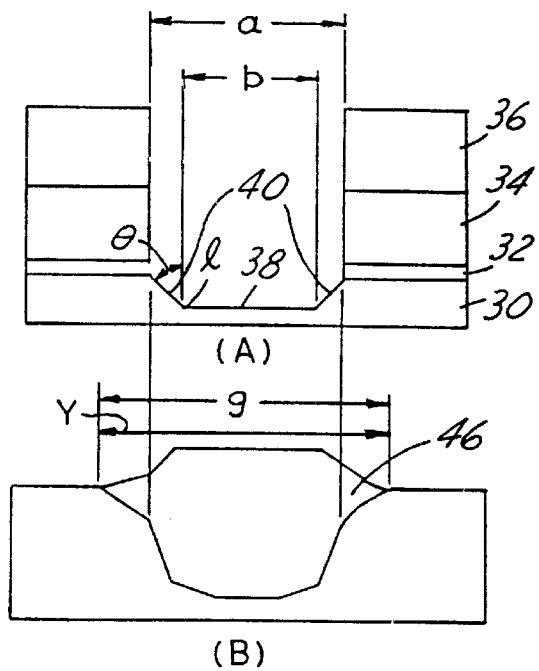
(PRIOR ART)
FIG. 1
FIG. 2
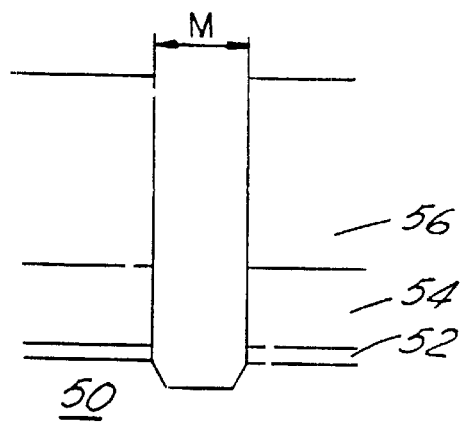
FIG. 3A
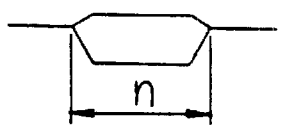
FIG. 3B

METHOD OF FORMING LOCAL OXIDATION WITH SLOPED SILICON RECESS

FIELD OF THE INVENTION

The present invention generally relates to a method of forming local oxidation in a semiconductor device and more particularly, relates to a method of forming local oxidation having reduced bird's beak encroachment in a semiconductor device.

BACKGROUND OF THE INVENTION

In the manufacturing of semiconductor devices, local oxidation of silicon (also known as LOCOS) is a widely used processing step in forming lateral isolation between devices on a chip. The LOCOS process produces a fairly planar surface which is highly desirable for resolving and patterning dense features on an integrated circuit chip.

In a typical LOCOS process, a thin layer of pad oxide 12 of approximately 10 nm thickness is first formed on the surface of a silicon substrate 14. A pad oxide layer is a thin silicon oxide layer that is formed directly on silicon. This is shown in FIG. 1A. A thicker layer of silicon nitride 16 of approximately 100 nm is then deposited on top of the oxide layer 12. A photoresist layer 18 is used to pattern the nitride layer 16 leaving nitride only over the active regions 20. Following a channel-stop implantation (not shown), the photoresist mask 18 is stripped, leaving the previously masked oxide/nitride layers 12, 16 defining the active regions 20. The silicon substrate 14 is then subjected to an oxidation cycle to grow a thick field oxide layer 22 of approximately 600 nm. This is shown in FIG. 1B. Even though the oxide grows mainly in areas where the silicon nitride layer is absent, it grows in both directions vertically and also laterally under the oxide/nitride layers 12, 16. The lateral growth results in a so-called "bird's beak" encroachment because of the shape of the oxide grown under the isolation mask. Since the beak to beak distance over the substrate not covered by oxide is the active transistor area, the smaller the beak the tighter devices can be packed on a substrate. In other words, the bird's beak encroachment leads to an active area that is narrower than originally patterned. When a large bird's beak is formed, the width of a transistor is reduced from that originally designed by photolithography. The growth of oxide under the nitride layer further causes stress problems in the oxide isolation formed. It is therefore desirable to form an oxide isolation that has the smallest bird's beak.

Other workers in the field of the LOCOS process have proposed various techniques to minimize the bird's beak effect. For instance, techniques such as side-wall masked isolation (or SWAMI) and poly-buffer LOCOS (or PBLOCOS) have been developed to reduce the effect of the bird's beak. Another modified LOCOS technique produces a 0.6 $\mu$m $P^+$–$P^{31}$ spacing by both substituting an oxinitride stress relieving layer for the silicon dioxide stress relieving layer in a conventional LOCOS process and by executing a sacrificial oxidation step prior to the growth of the channel oxide layer.

Still others have attempted to improve the LOCOS process. For instance, U.S. Pat. No. 5,254,495 discloses a method in which a suicide recessing process is incorporated into the local oxidation process. The process requires the additional steps of depositing a metal layer overlying the silicon nitride layer into the opening of the substrate, ion implanting channel-stops into the substrate, forming suicide between metal and the silicon substrate, and removing the metal silicide regions. It is therefore a more complicated process that incurs additional processing time and costs.

It is therefore an object of the present invention to provide a method of forming a localized oxidation in a semiconductor substrate with reduced oxide encroachment that does not have the drawbacks and shortcomings of the prior art methods.

It is another object of the present invention to provide a method of forming a localized oxidation with reduced oxide encroachment without the need for additional processing steps.

It is a further object of the present invention to provide a method for localized oxidation with reduced bird's beak encroachment that can be carried out in a conventional LOCOS process.

It is another further object of the present invention to provide a method for localized oxidation with reduced bird's beak encroachment that is capable of reducing the encroachment length significantly.

It is yet another object of the present invention to provide a method for localized oxidation with reduced oxide encroachment that can be carried out by first providing a sloped silicon recess in the substrate prior to the oxide formation.

SUMMARY OF THE INVENTION

In accordance with the present invention, a method of forming local oxidation having minimum lateral oxide growth or bird's beak encroachment is provided. The method also provides a local oxidation with reduced residual stress in the oxide.

In a preferred embodiment, the method of forming a local oxidation is carried out by first providing a sloped silicon recess in the silicon substrate during a recess etching process. While any method can be used to provide a sloped silicon recess to achieve the desirable result, a novel etchant gas mixture is used in the present invention method. The sloped sidewalls of the silicon recess in the substrate effectively move the bottom of the exposed silicon away from the patterning resist edge. When compared to non-sloped silicon sidewalls, the encroaching oxidation starts with a built-in offset from the patterning edge which leads to a reduction in encroachment. Another benefit achieved by the present invention method is the reduction of stress in the oxide formed. The method greatly reduces stress defects in silicon generally caused by aggressive nitride to pad oxide thickness ratio in an attempt to reduce bird's beak.

In the preferred embodiment, the present invention method is carried out by first providing a silicon substrate, forming a pad oxide layer on top of the substrate, forming a dielectric layer on top of the pad oxide layer, depositing a photoresist layer that has openings over areas of oxide isolations to be formed on the dielectric material layer, removing the dielectric material, the silicon oxide, and the silicon in the openings by an etching process such that a tapered recess is formed in the silicon substrate, growing a field oxide region within the tapered recess in the silicon substrate, and removing the layers of dielectric material and silicon oxide from the silicon substrate. The desirable range of taper for the silicon sidewalls in the recess is between about 10° and about 75° as measured from the vertical axis of the recess opening.

BRIEF DESCRIPTION OF THE DRAWINGS

Other objects, features and advantages of the present invention will become apparent upon consideration of the specification and the appended drawings, in which:

FIGS. 1A and 1B are enlarged cross-sectional views of a prior art method of forming local oxidation in a silicon substrate.

FIGS. 2A and 2B are enlarged cross-sectional views of the present invention method of forming a local oxidation in a silicon substrate.

FIGS. 3A and 3B are enlarged cross-sectional views of an etched/preLOCOS sample and a subsequently formed LOCOS, respectively.

DETAILED DESCRIPTION OF THE PREFERRED EMBODIMENT

The present invention provides a method of forming oxide isolation that has reduced bird's beak encroachment in a semiconductor device. The method is particularly suitable for LSI and VLSI devices where circuits are densely packed on a semiconductor chip. The method allows a minimal bird's beak encroachment of the local oxidation such that the space required for isolation between devices on a chip can be minimized.

Referring initially to FIGS. 2A and 2B, it is shown in FIG. 2A a monocrystalline silicon substrate 30 and a layer 32 of pad oxide deposited over substrate 30 by a method of thermal oxidation. The thickness of the pad oxide layer 32 deposited is in the range between about 3 nm and about 50 nm. A layer of silicon nitride 34 is then deposited on the oxide layer 32 by a chemical vapor deposition technique to a thickness of between about 50 nm and about 300 nm.

Conventional lithography and plasma dry etching technique are carried out by using a layer of photoresist 36 to provide opening 38 in the silicon substrate 30 at a location where a local oxidation is to be formed. The silicon nitride, silicon oxide and silicon in the opening 38 are then removed by an etching process such that a tapered recess 40 is formed in the silicon substrate 30. The tapered recess 40 formed in the silicon substrate 30 has a taper between about 10° and about 75° as measured from the vertical axis of the recess opening 38. A more preferred taper is in the range between about 25° and about 60° measured from the vertical axis.

The etching technique utilized in the present invention preferred embodiment uses an etchant gas system of $C_2F_6$ and $CHF_3$ at a chamber pressure between about 10 and about 2000 m torr for a time period between about 5 and about 60 seconds. Other suitable etchant gases are $SF_6$, $O_2$, $CF_4$, $C_3F_8$, $C_2H_2F_4$ and $C_2HF_5$. Still other suitable etchant systems that contains carbon and fluorine can be used to achieve the same desirable results of the present invention. Other removal techniques such as by laser may also be used.

As shown in FIG. 2B, a field oxide region 46 of approximately 500 nm thickness is grown at a temperature of approximately 1050° C. for a time period of approximately 20 minutes in dry oxygen, or approximately 55 minutes in wet oxygen ($H_2O/O_2$). The silicon nitride layer 34 and the silicon oxide layer 32 are subsequently removed by conventional wet etching method, utilizing acid.

During the oxidation of the silicon, the volume of silicon oxide expands greatly from that of the silicon. The volume of the silicon oxide therefore grows in both the vertical and the horizontal directions. In the preferred embodiment, during the oxidation process, the silicon oxide expands less in the lateral direction due to the restraint by the nitride layer 34 on top. The nitride layer 34 therefore suppresses the lateral growth of the oxide 46. The lateral growth of oxide under the nitride film is limited due to the pressure of the nitride film and the limiting supply of oxygen as the oxide grows toward the peak of the bird's beak.

The present invention method therefore minimizes the lateral growth of oxide 46. The pad oxide layer 32 serves as buffer between the nitride 34 and the silicon substrate 30 so that the silicon is not damaged by stress during the growth of oxide. The function of the pad oxide layer 32 is similar to a soft pad for stress relief during the suppression of the lateral growth of the oxide. The pad oxide layer 32 preferably should have a thickness of not less than 3 nm.

As shown in FIG. 2A, the recessed opening 38 of the silicon substrate 30 has sloped sidewalls 40. The sloped sidewalls 40 form an angle $\Theta$ with the vertical axis of the recess opening 38. The value of $\Theta$ is between about 10° and about 75°, and preferably between about 25° and about 60°. During the oxidation, the silicon at location 1 as shown in FIG. 2A is further away from the edge of the photoresist 36 when compared to the lowest point of silicon m in FIG. 1A. The position difference between l and m can be expressed as ½ (a–b) where a is the diameter of the photoresist opening and b is the diameter of the base of the recess opening 38. The starting point of oxidation in the sloped recess opening 38, i.e. the lowest point in the silicon, is therefore at an offset, i.e. ½ (a–b) away from that in the vertical recess opening 18. As a result, different lateral expansions are obtained in the sloped recess opening 38 and the vertical recess opening 18. The bird's beak length y shown in FIG. 2B is therefore substantially less than the bird's beak length x shown in FIG. 1B. A reduction in the bird's beak length of approximately 10–90% has been observed.

The difference between a as shown in FIGS. 1A, 2A and f or g is recognized as delta W or ΔW, which is two times the bird's beak length. It should be noted that the present invention method can be applied to other dielectric materials other than silicon nitride.

EXAMPLE

An example of the present invention preferred embodiment is shown in FIGS. 3A and 3B. A silicon substrate 50 is first provided and a thin layer of pad oxide 52 is formed to a thickness of 10 nm. A layer of silicon nitride 54 of approximately 100 nm thick is then deposited on top of the pad oxide layer 52. A resist layer 56 is subsequently deposited which has an opening of m. An etching process is performed by using an etchant gas mixture of $C_2F_6$ at a flow rate of 20 sccm and $CHF_3$ at a flow rate of 30 sccm in a commercial Drytek® etch machine. The RF power employed is between 100 and 600 W. After the etching process, a nitride sidewall slope of approximately 5° from the vertical axis of the opening is obtained with a silicon sidewall slope of 25°. The total thickness of the field oxide grown is approximately 500 nm. The bird's beak length, i.e. ½ ΔW, obtained is m–n.

The ΔW measured for a vertical silicon recess, i.e. a control sample is 0.398 nm, while ΔW measured for a sloped silicon recess (a trench) is 0.215 nm. A reduction in the bird's beak encroachment of approximately 50% is therefore achieved.

The present invention method also provides the benefit of maintaining the device at a minimum breakdown voltage. It is known that one of the criteria for oxide isolation is that once the oxide is grown, there must not be any leakage going across from one side of the active area to the opposite side of the active area. There must be a minimum acceptable breakdown voltage maintained between one side and the opposite side in order to avoid or eliminate cross-talk between the neighboring active areas. The present invention method therefore further provides the benefit of preventing leakage between supposedly isolated areas by building a more efficient LOCOS.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A method of forming an isolation structure in a semiconductor device by local oxidation of silicon (LOCOS), comprising the steps of:

forming a recess in a silicon substrate having thereon, in sequential order, a pad oxide layer, a silicon nitride layer, and a photoresist layer having an opening over an area corresponding to said isolation structure to be formed in said silicon substrate, such that said recess has a taper of from 10° to 75° as measured from a vertical axis of said opening, growing a field oxide within said recess such that an upper surface of said field oxide is substantially above an upper surface of said silicon substrate, without substantial formation of a bird's head, and removing said silicon nitride layer and said silicon oxide layer from the top surface of said silicon substrate.

2. A method according to claim 1, wherein said pad oxide layer has a thickness between 3 and about 50 nm, and said silicon nitride layer and said pad oxide layer have respective thicknesses in a ratio of at least 10:1.

3. A method according to claim 1, wherein said taper is from 25° to 60° as measured from the vertical axis of said opening.

4. A method of isolating a semiconductor device comprising the steps of:

forming a tapered recess in a silicon substrate having thereon, in sequential order, a pad oxide layer having a thickness between 3 nm and about 50 nm, a silicon nitride layer, and a photoresist layer having window openings over isolation areas to be formed in said silicon substrate, said silicon nitride layer and said pad oxide layer having respective thicknesses in a ratio of at least 10:1, growing a field oxide within said tapered recess such that an upper surface of said field oxide is substantially above an upper surface of said silicon substrate, without substantial formation of a bird's head, and removing said silicon nitride layer and said pad oxide layer from said silicon substrate.

5. A method according to claim 4, further comprising the step of depositing said silicon nitride layer by chemical vapor deposition.

6. A method according to claim 5, wherein said silicon nitride layer has a thickness of from about 50 nm to about 300 nm.

7. A method according to claim 4, wherein said removing step comprises the step of etching said silicon nitride layer, said pad oxide layer and said silicon substrate with an enchant gas comprising carbon and fluorine for a period of time of not less than 5 seconds.

8. A method according to claim 4, wherein said removing step comprises the step of wet etching said silicon nitride layer and said pad oxide layer with an acid.

9. A method according to claim 4, wherein said tapered recess in said silicon substrate has a taper of at least 10° as measured from the vertical axis of said window opening.

10. A method according to claim 9, wherein said tapered recess has a taper of from 10° to about 75° as measured from the vertical axis of said window opening.

11. A method according to claim 4, wherein said thickness of said silicon oxide is at least 10 nm.

12. A semiconductor device having an oxide isolation region formed according to the method of claim 4.

13. The method of claim 4, wherein said removing step comprises reactive ion etching with an echant gas comprising $C_2F_6$ and $CHF_3$ at a RF power of not less than 100 W for a length of time sufficient to form said tapered recess in said silicon substrate, said tapered recess in said silicon substrate having a taper of at least 10° as measured from the vertical axis of said opening.

14. The method of claim 13, further comprising the step of forming said pad oxide layer by thermal oxidation or by chemical vapor deposition.

15. The method of claim 13, further comprising the step of chemical vapor depositing said silicon nitride layer to a thickness of from 50 nm to about 300 nm.

16. The method of claim 13, wherein said silicon nitride layer, said pad oxide layer, and said silicon substrate in the openings are exposed to an etchant gas for at least 5 seconds.

17. The method of claim 13, further comprising the step of removing said silicon nitride layer by etching with phosphoric acid and removing said pad oxide layer by etching with hydrofluoric acid.

18. The method of claim 13, wherein said tapered recess has a taper of from 10° to about 75° as measured from the vertical axis of said window opening.

19. The method of claim 10, wherein said taper is from 25° to 60° as measured from the vertical axis of said window opening.

20. A silicon substrate having a local oxidation structure formed therein according to the method of claim 13.

* * * * *